United States Patent [19]

Takizawa

[11] 4,254,303

[45] Mar. 3, 1981

[54] AUTOMATIC VOLUME ADJUSTING APPARATUS

[75] Inventor: Tetsuya Takizawa, Yamato, Japan

[73] Assignee: Viva Co., Ltd., Noda, Japan

[21] Appl. No.: 64,384

[22] Filed: Aug. 8, 1979

[30] Foreign Application Priority Data

Aug. 26, 1978 [JP] Japan .................................. 53-103385
Nov. 25, 1978 [JP] Japan .................................. 53-144943
Dec. 20, 1978 [JP] Japan .................................. 53-156239

[51] Int. Cl.³ ............................................. H03G 1/02
[52] U.S. Cl. .................................. 179/1 VL; 179/1 P
[58] Field of Search ............... 179/1 VL, 1 P, 1 MN; 330/144, 86, 51, 110

[56] References Cited

U.S. PATENT DOCUMENTS

| | | | |
|---|---|---|---|
| 2,338,551 | 1/1944 | Stanko | 179/1 P |
| 3,410,958 | 11/1968 | Cohen | 179/1 P |
| 3,814,856 | 6/1974 | Dugan | 179/1 VL |
| 3,934,084 | 1/1976 | Munson et al. | 179/1 VL |
| 3,934,085 | 1/1976 | Munson et al. | 179/1 VL |
| 4,147,892 | 4/1979 | Miller | 179/1 VL |

*Primary Examiner*—Daryl W. Cook
*Attorney, Agent, or Firm*—Frishauf, Holtz, Goodman & Woodward

[57] ABSTRACT

An automatic volume adjusting apparatus comprises a volume adjusting device connected between a sound signal source and a loudspeaker; a first rectifier circuit for generating a first signal having a D.C. level corresponding to the level of a sound signal supplied from the colume adjusting device to the loudspeaker; a microphone and a second rectifier circuit for generating a second signal having a D.C. level corresponding to the level of a composite sound constituted by the sound generated by the loudspeaker and the ambient noise; a subtraction circuit for generating a third signal having a level corresponding to the level difference between the first and second signals, i.e. the level of the ambient noise; a gate circuit for sampling the third signal at predetermined intervals; and an integrator circuit for holding the output of the gate circuit for a predetermined period of time. The output of the integrator circuit controls the volume adjusting device.

5 Claims, 7 Drawing Figures

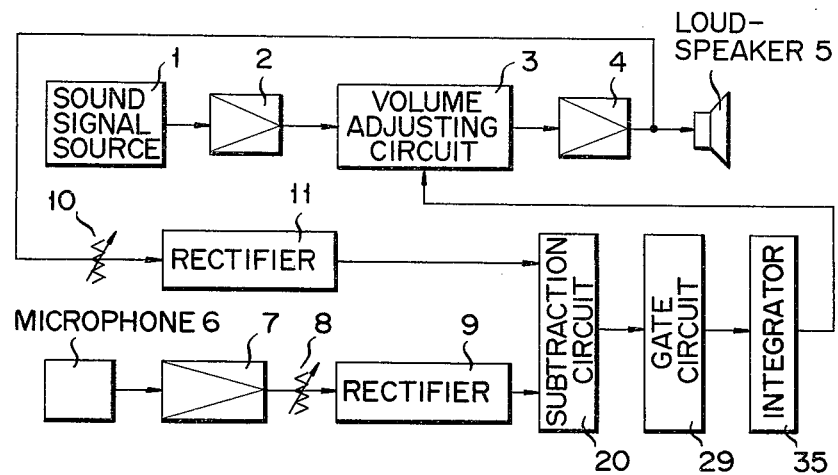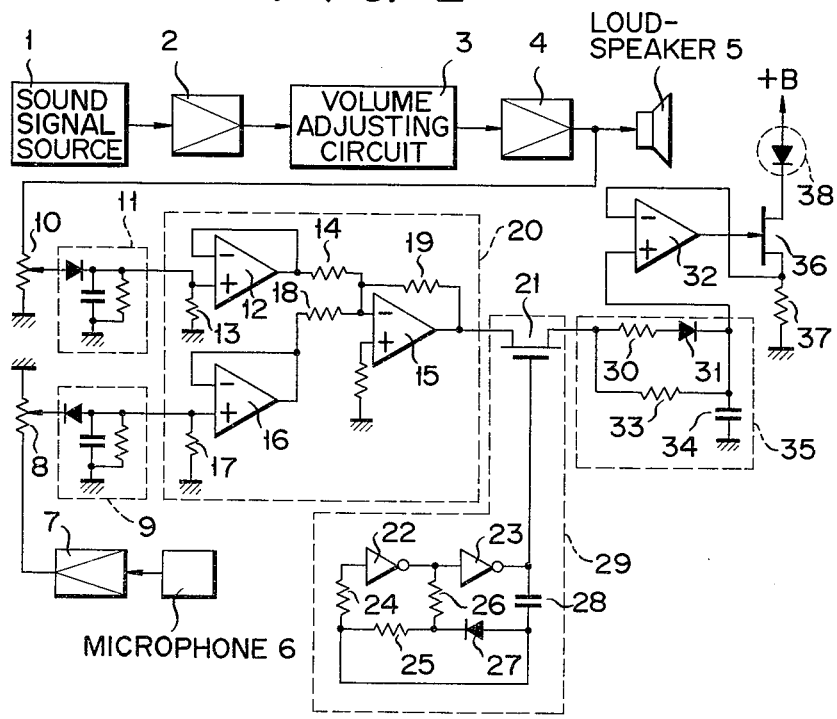

AUTOMATIC VOLUME ADJUSTING APPARATUS

BACKGROUND OF THE INVENTION

This invention relates to an automatic volume adjusting apparatus which can correctly adjust the volume of sound from a loudspeaker in accordance with the variation of ambient noise level.

Many attempts have been made to automatically adjust the volume of sound from the audio output device of a television set, a radio, a tape recorder, a loudspeaker and the like, in accordance with the variation of ambient noise level. And many methods have been proposed to achieve such an automatic volume adjusting. Notable among them are as follows:

(a) A microphone is used to detect a composite sound constituted by the ambient noise and the sound from a loudspeaker. Only the ambient noise component of the composite sound is removed and detected from a composite sound signal generated by a sound signal circuit. The ambient noise component is used to control the gain of an audio output device.

(b) The ambient noise is detected when a loudspeaker does not generate sound. According to the level of the ambient noise one of static circuits such as switches which have a self-holding function is selected thereby to control the volume of sound generated by the loudspeaker.

With the method (a), however, it is difficult to remove and detect only the ambient noise component from the composite sound constituted by the ambient noise and the sound from the loudspeaker, that is, to completely cancel out the electric signal from the sound signal circuit and the sound generated by the loudspeaker. This is because the sound from the loudspeaker involves in phase delay, the loudspeaker and microphone differ in frequency characteristic, or for some other reasons. If the electric signal and the sound could be cancelled out almost completely, the ambient noise would be masked by the sound from the loudspeaker when the sound volume increases to a certain level. As a result, the microphone would fail to detect the ambient sound, and the sound volume could no longer increase. Consequently, the volume adjustment would become unstable.

In the method (b) the volume adjustment is carried out somewhat statically. The method (b) is not therefore practical in case the ambient noise changes abruptly or periodically while a loudspeaker is generating sound. With the method (b) it is next to impossible to adjust the sound volume particularly when the loudspeaker generates a continuous sound such as music. This is because in this case the loudspeaker is rarely silent so that the volume of sound from it is maintained at constant level.

Accordingly, it is an object of this invention to provide an automatic volume adjusting apparatus which is so designed as to increase or reduce the volume of sound generated by a loudspeaker accurately in accordance with the level of the ambient noise, regardless of masking phenomenon which occurs when the volume of sound from the loudspeaker increases to a certain level according to the ambient noise level.

SUMMARY OF THE INVENTION

According to this invention, there is provided an automatic volume adjusting apparatus which comprises a volume adjusting device connected between a sound signal source and a loudspeaker, means for generating a first signal corresponding to the level of a sound signal supplied from the sound signal source to the loudspeaker, means for generating a second signal corresponding to the level of a composite sound constituted by the sound generated by the loudspeaker and the ambient noise, means for processing the first and second signals so as to generate a third signal corresponding substantially to only the level of the ambient noise, means for sampling the third signal at predetermined intervals, means for holding the output of the sampling means for a predetermined period of time, and means for controlling, according to the output of the holding means, the level of the sound signal passing through the volume adjusting device.

With the apparatus of such construction, the volume adjusting device is controlled by the third signal which is sampled and then held immediately before a maskings phenomenon takes place. Thus, the volume of sound from the loudspeaker never fails to be controlled according to the ambient noise level in spite of the masking phenomenon which occurs when the volume of sound from the loudspeaker is extremely large.

BRIEF DESCRIPTION OF THE DRAWINGS

FIG. 1 is a block circuit diagram of an automatic volume adjusting apparatus according to this invention;

FIG. 2 is a circuit diagram showing the apparatus of FIG. 1 more in detail;

DETAILED DESCRIPTION OF THE PREFERRED EMBODIMENTS

Figure 3:
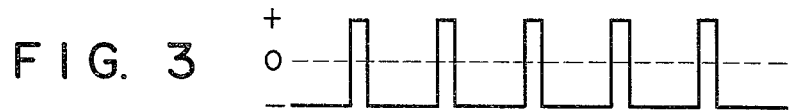
FIG. 3 illustrates the output waveform of a non-stable multivibrator shown in FIG. 2.

As shown in FIGS. 1 and 2, a sound signal is supplied from a sound signal source 1 such as a television set, a radio, a tape recorder and a microphone through a preamplifier 2 to a volume adjusting circuit 3. The level of the sound signal is adjusted by the circuit 3, and the sound signal is then amplified by a power amplifier 4 and finally converted into sound by a loudspeaker 5. The sound thus generated by the loudspeaker 5 and the ambient noise are detected by a microphone 6, which produces a detection signal corresponding to a composite sound constituted by the sound from the loudspeaker 5 and the ambient noise. The detection signal is amplified by a microphone amplifier 7 and supplied through a level adjustor 8 to a rectifier 9. The rectifier 9 converts of the detection signal into, for example, a negative D.C. output. The sound signal from the power amplifier 4 is supplied through a level adjustor 10 to a rectifier 11. The rectifier 11 converts the sound signal into, for example, a positive D.C. output. The output of the rectifier 11 is coupled to the non-inversion input of a buffer 12 and to the ground via a resistor 13. The output of the buffer 12 is connected to the inversion input of the buffer 12 and to the non-inversion input of an inversion adder-amplifier 15 through a resistor 14. The output of the rectifier 9 is coupled to the non-inversion input of a buffer 16 and to the ground through a resistor 17. The output of the buffer 16 is connected to the inversion input of the buffer 16 and to the inversion input of the inversion adder-amplifier 15 via a resistor 18. The output of the inversion adder-amplifier 15 is connected to the non-inversion input of the adder-amplifier 15 via a resistor 19 and to the drain of an analog switch 21. The buffers 12, 16, inverson adder-amplifier 15, and resistors 13, 14, 17, 18, 19 constitute a subtraction circuit 20.

As shown in FIG. 2, inverters 22 and 23, resistors 24, 25 and 26, a diode 27 and a capacitor 28 constitute a non-stable multivibrator of the known type. The output of the multivibrator is coupled to the gate of the analog switch 21. The non-stable multivibrator and the analog switch 21 constitute a gate circuit 29. The source of the analog switch 21 is connected to the non-inversion input of a buffer 32 through a resistor 30 and a diode 31 and also to the non-inversion input of the buffer 32 through a resistor 33. The non-inversion input of the buffer 32 is connected to the ground via a capacitor 34. The diode 31, resistors 30 and 33 and the capacitor 34 constitute an integrator 35 having a time constant which is determined by the rated values of the constituent elements. The invention input of the buffer 32 is coupled to the source of a field effect transistor 26 (hereinafter called "FET") and to the ground through a resistor 37. The output of the buffer 32 is connected to the gate of the FET 36. The drain of the FET 36 is connected to the cathode of a light-emitting diode 38, the anode of which is connected to a positive D.C. power source +B. The light-emitting diode 38 is integrally formed with a light-receiving element 40 such as a CdS element. The light-receiving element 40 and two resistors 39 and 41 constitute the volume adjusting circuit 3.

The buffers 12, 16 and 32, inversion adder-amplifier 15, inverters 22 and 23 and analog switch 21 are supplied with power from the positive D.C. power source +B and a negative D.C. power source —B.

Now it will be described how the embodiment of FIGS. 1 and 2 operates. According to the frequency characteristics of the loudspeaker 5 and the microphone 6 and the positional relationship between the loudspeaker 5 and the microphone 6, the level adjustors 8 and 10 and the rectifiers 9 and 11 are controlled so that the absolute values of D.C. outputs of the rectifiers 9 and 11 become substantially equal when there is no ambient noise.

The D.C. output of the rectifier 9 is supplied to the buffer 16, and the D.C. output of the rectifier 11 to the buffer 12. At the output terminals of the buffers 12 and 16 there are obtained outputs of the same polarity. The inversion adder-amplifier 15 obtains an output which is determined by the sum of the outputs of the buffers 12 and 16, the resistances of the resistors 14, 18 and 19 and the amplification factor of the adder-amplifier 15. This output is the output of the subtraction circuit 20. Since the negative D.C. output of the rectifier 9 and the positive D.C. output of the rectifier 11 have substantially the same absolute value when no ambient noise exists, the sum of them becomes a negative voltage when there is an ambient noise. Thus, the output of the inversion adder-amplifier 15, i.e. the output of the subtraction circuit 20, is a positive voltage which is proportional to the ambient noise component.

The multivibrator of the gate circuit 29 produces a pulse output having such a waveform as illustrated in FIG. 3. As shown in FIG. 3, the pulse output has a relatively short positive potential period and a long negative potential period. This pulse output is supplied to the gate of the analog switch 21. During the positive potential period of the pulse output the drain-source path of the analog switch 21 is conductive. During the negative potential period of the pulse output the drain-source path of the switch 21 is non-conductive. As a result, the gate circuit 29 effects the sampling of the output of the subtraction circuit 20.

The resistor 30 of the integrator 35 has such a resistance that the forward resistance of the diode 31 can be neglected with respect to the resistance of the resistor 30. Further, the resistor 33 of the integrator 35 has a resistance far higher than that of the resistor 30. The charge time constant charged between the terminals of the capacitor 34 is therefore determined substantially by the resistor 30 and the capacitor 34. On the other hand, the discharge time constant of the integrator 35 is determined substantially by the resistor 33 and the capacitor 34 since the backward resistance of the diode 31 is extremely high. Consequently, the charge time constant becomes much smaller than the discharge time constant. In other words, the write-in time constant of the integrator 35 is small, and the read-out time constant is large. The relationship between the pulse width during the positive potential period and the charge, discharge time constant is determined by the ratio between the positive pulse width and the charge time constant. The ratio between the positive pulse width and the charge time constant is properly selected so that the latter is sufficiently large with respect to the former.

The positive D.C. output of the subtraction circuit 20 is charged between the terminals of the capactior 34 while the analog switch 21 is closed, according to the time constant determined by the resistor 30 and the capacitor 34. While the analog switch 21 is not conductive, the drain-source impedance of the switch 21 and the input impedance of the buffer 32 are extremely high. The potential of the capacitor 34 is therefore maintained at the value immediately before the analog switch 21 has become non-conductive.

In this way, the positive D.C. output of the subtraction circuit 20 is charged in the capacitor 34 according to the time constant determined by the resistor 30 and the capacitor 34, every time the analog switch 21 becomes conductive. Since the charge time constant for charging the output of the subtraction circuit 20 to the capacitor 34 is small, the potential across the terminals of the capacitor 34 elevates in a quick response to the increase of ambient noise.

The positive D.C. voltage obtained across the terminals of the capacitor 34 is supplied to the non-inversion input of the buffer 32. Since the buffer 32, FET 36 and resistor 37 constitute a constant current circuit which uses the light-emitting diode 38 as its load, there flows in the light-emitting diode 38 a current which is proportional to the positive D.C. voltage suppled to the buffer 32 and the resistance of the resistor 37. The resistance of the CdS element 40, which is integrally formed with the light-emitting diode 38, becomes lower as the current flowing in the light-emitting diode 38 increases, and the attenuation ratio of the volume adjusting circuit 3 becomes smaller. As a result, the input level of the power amplifier 4 elevates, thus increasing the sound volume of the loudspeaker 5.

The louder the sound from the loudspeaker 5 grows, the higher become the negative D.C. output level of the rectifier 9 and the positive D.C. level of the rectifier 11. If there is no ambient noise, the sound component in the output of the subtraction circuit 20 is substantially zero since the absolute values of the D.C. outputs of the rectifiers 9 and 11 are identical. If an ambient noise exists, the output of the subtraction circuit 20 contains a noise component corresponding to the ambient noise. Thus, the loudspeaker 5 generates sound the volume of which is proportional to the ambient noise component in the output of the subtraction circuit 20. When the ambient noise ceases under this condition, the output level of the subtraction circuit 20 is reduced to substantially zero. As a result, the capacitor 34 is discharged through the resistor 33 while the analog switch 21 remains conductive. Since the discharge time constant is large, the volume of sound from the loudspeaker 5 gradually increases until it reaches the initial value.

When the ambient noise becomes very large and so does the volume of sound from the loudspeaker 5, the sound from the loudspeaker 5 masks the ambient noise, thus making it difficult for the microphone 6 to detect the ambient noise. This phenomenon is equivalent to the level drop of ambient noise. As a result, the volume of sound from the loudspeaker 5 will likely be reduced. In effect, however, the potential between the terminal of the capacitor 34 would never be lowered abruptly. This is because the discharge time sonstant determined by the resistor 33 and the capacitor 34 is much larger than the value corresponding to the period during which the analog switch 21 is conductive, and the period during which the analog switch 21 is non-conductive is much larger than the period during which the switch 21 remains conductive.

Further, the charge time constant determined by the resistor 30 and the capacitor 34 is selected to have a proper value with respect to the period during which the analog switch 21 remains conductive. In addition, it is quite rare that the sound signal source 1 keeps generating high level sound signals for a long time even if the signals represent a continuous musical sound. The sound signal source 1 produces signals of a low level for a period of time, though a short one. During such a period of time the ambient noise component in the output of the subtraction circuit increases equivalently. Thus, only if analog switch 21 is conductive during this period, the capacitor 34 is charged again with the ambient noise component in a very short time to have its potential raised. Consequently, the masking of the ambient noise can be suppressed even when the volume of sound from the loudspeaker 5 is relatively large, whereby the volume of sound is adjusted in a natural way.

Needless to say, the volume adjusting circuit 3 may be constituted by transistors which are voltage-controlled to vary the level of an input sound signal, instead of a photo-coupler constituted by an electric-to-light converter such as a light-emitting diode and a light-to-electric converter such as a CdS element.

Figure 4:
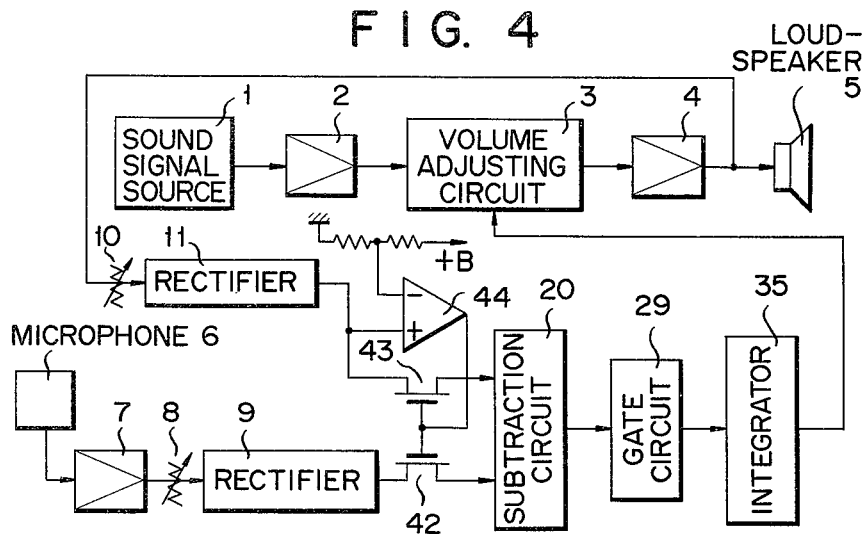
FIGS. 4 and 5 are block circuit diagrams showing other embodiments of this invention.
Figure 5:
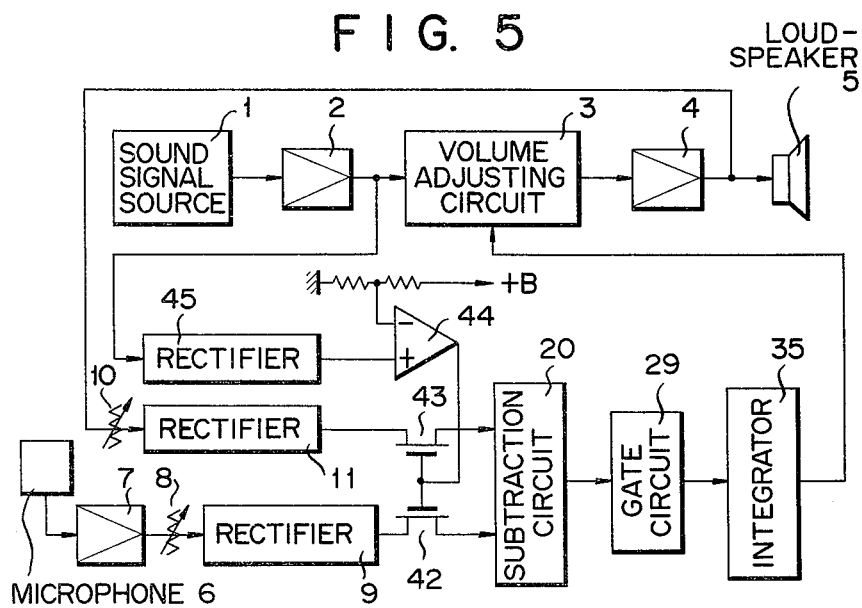

FIGS. 4 and 5 illustrate other embodiments of this invention. Unlike the embodiment shown in FIGS. 1 and 2, these embodiments can prevent the volume of sound from the loudspeaker from momentarily growing too large when the loudspeaker starts generating sound. Now referring to FIGS. 4 and 5 wherein like or the same numerals are used to denote like or the same parts as those of the embodiment shown in FIGS. 1 and 2, these embodiments will be described.

In the embodiment of FIG. 4, an analog switch 42 is connected between a rectifier 9 and a subtraction circuit 20, and another analog switch 43 between the subtraction circuit 20 and a rectifier 11. Further, a comparator 44 is connected to the output of the rectifier 11. When the output level of the rectifier 11 is substantially zero, the output of the comparator 44 renders both analog switches 42 and 43 non-conductive, whereby the outputs of the rectifiers 9 and 11 are not supplied to the subtraction circuit 20. In the embodiment of FIG. 5, a rectifier 45 is provided to rectify the input sound signal to a volume adjusting circuit 3. The output of the rectifier 45 operates a comparator 44. When the output level of the rectifier 45 is zero, analog switches 42 and 43 rendered non-conductive, whereby the outputs of rectifiers 9 and 11 are not supplied to a subtraction circuit 20. In all the other respects the embodiments of FIGS. 4 and 5 are identical with the embodiment of FIGS. 1 and 2.

In the embodiments of FIGS. 1 and 2, FIG. 4 and FIG. 5, the gate circuit 29 samples out the output of the subtraction circuit 20 which corresponds to an ambient noise component. The output of the gate circuit 29 is held by the integrator 35 and controls the volume adjusting circuit 3 even when the ambient noise is masked by the sound from the loudspeaker 5, thus preventing a level drop of the sound from the loudspeaker 5. But, since the masking phenomenon occurs when the output sound level of the loudspeaker 5 rises beyond a specific value, it should be better to use the output of the subtraction circuit 20 to control the volume adjusting circuit 3 so long as the output sound level of the loudspeaker 5 is below the specific value.

Figure 6:
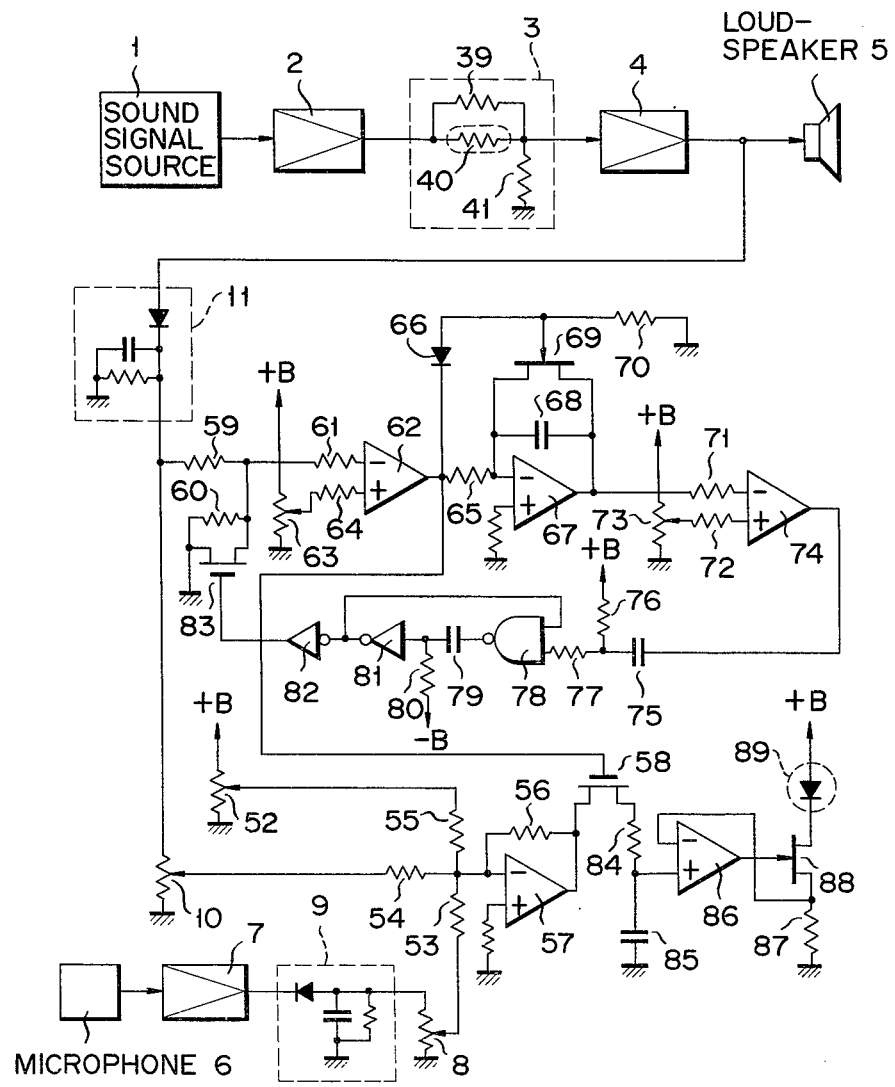
FIGS. 6 and 7 are circuit diagrams of still other embodiments of this invention.

This invention provides an automatic volume adjusting apparatus of another type in which the volume adjusting mode is changed to another in accordance with the output sound level of a loudspeaker. FIG. 6 shows such an automatic volume adjusting apparatus.

As shown in FIG. 6, the output of a rectifier 9 is supplied to a level adjustor 8, and its level is adjusted by the level adjustor 8. The output of the level adjustor 8 is supplied to the inversion input of an inversion adder-amplifier through a resistor 53. The output of a rectifier 11 is supplied to a level adjustor 10, which adjusts the level of the output of the rectifier 11. The output of the level adjustor 10 is supplied to the inversion input of the inversion adder-amplifier 57. Another level adjustor 52 is connected between the ground and a positive D.C. power source +B. The output positive D.C. voltage of the level adjustor 52 is supplied via a resistor 55 to the inversion input of the inversion adder-amplifier 57. The output of the adder-amplifier 57 is coupled to the inversion input of the adder-amplifier 57 through a resistor 56 and to the drain of an analog switch 58. The output level of the adder-amplifier 57 is determined by the sum of the outputs of the level adjustors 8, 10 and 52, the resistance of the resistors 53–56 and the amplification factor of the adder-amplifier 57.

The output of the rectifier 11 is voltage-divided by resistors 50 and 51 and then supplied via a resistor 61 to the inversion input of a level comparator 62. A voltage adjustor 63 is connected between the ground and the positive D.C. power source +B to provide a D.C. voltage. The D.C. voltage is applied to the non-inversion input of the level comparator 62 through a resistor 64. The output of the level comparator 62 is coupled to the gate of the analog switch 58, to the inversion input of an integrator 67 via a resistor 65 and to the cathode of a diode 66. Between the inversion input and output of the integrator 67 there is connected a capacitor 68. Further, a FET 69 has its source and drain connected to the inversion input and output of the integrator 67, respectively. The gate of the FET 69 is connected to the anode of the diode 66 and to the ground via a resistor 70. The output of the integrator 67 is coupled to the inversion input of a level comparator 74 via a resistor 71. The non-inversion input of the level comparator 74 is connected to receive via a resistor 72 a positive D.C. voltage from a voltage adjustor 73 which is connected between the ground and the positive D.C. power source +B. The output of the level comparator 74 is coupled to one terminal of a capacitor 75. The terminal of the capacitor 75 is connected to one input of a two-input NAND circuit 78 through a resistor 77 and to the positive D.C. power source +B through a resistor 76. The output of the NAND circuit 78 is connected to the input of an inverter 81 via a capacitor 79. The input of the inverter 81 is connected to a negative D.C. power source −B through a resistor 80. The output of the inverter 81 is connected to the other input of the NAND circuit 78 and to the input of an inverter 82. The output of the inverter 82 is connected to the gate of an analog switch 83, the drain and source of which are connected to the both ends of a resistor 60, respectively.

The source of the analog switch 58 is connected via a resistor 84 to the non-inversion input of a non-inversion amplifier 86. The non-inversion input of the amplifier 86 is connected to the ground through a capacitor 85. The inversion input of the non-inversion amplifier 86 is connected to the source of a FET 88 and to the ground through a resistor 87. The output of the amplifier 86 is coupled to the gate of the FET 88. The drain of the FET 88 is connected to the cathode of a light-emitting diode 89, the anode of which is connected to the positive D.C. power source +B. As in the embodiment of FIG. 2, the light-emitting diode 89 is coupled optically to a light-receiving CdS element 39.

Now it will be described how the automatic volume adjusting apparatus of FIG. 6 operates.

According to the frequency characteristics of the loudspeaker 5 and the microphone 6 and the positional relationship between the loudspeaker 5 and the microphone 6, the level adjustors 8 and 10 are controlled so that the D.C. output of the rectifier 11 has substantially the same absolute value as, or an absolute value larger than, that of the rectifier 9 with respect to frequencies within the audible frequency range. If the level adjustor 52 produces a positive D.C. voltage having substantially the same absolute value as that of a negative D.C. output of the rectifier 9 which is produced when the loudspeaker 5 generates no sound and which corresponds to the volume of ambient noise, the sum of the outputs of the level adjustors 8, 10 and 52 will be substantially zero or a positive value. If the voltage of the voltage adjustor 63 is higher than the maximum value of a positive D.C. voltage obtained by dividing the output voltage of the rectifier 11 by means of resistors 59 and 60, the output of the level comparator 62 is a positive potential. Then, the gate of the analog switch 58 has a positive potential, whereby the drain-source path of the analog switch 58 becomes conductive. As a result, the non-inversion amplifier 86, the FET 88 and the resistor 87 constitute a constant current circuit, and there flows in the light-emitting diode 89 a current proportional to the resistance of the resistor 87 and the positive D.C. voltage applied to the non-inversion input of the non-inversion amplifier 86. The resistor 84 and the capacitor 85 both connected to the non-inversion input of the non-inversion amplifier 86 constitute a time constant circuit for smoothening the varying output of the adder-amplifier 57.

Since the output of the adder-amplifier 57 is substantially zero or has a negative value, the input voltage of the non-inversion amplifier 86 becomes substantially 0V or lower than 0V. As a result, no current flows through the light-emitting diode 89. The CdS element 40 therefore underdoes no resistance change. Consequently, the attenuation ratio of the volume adjusting circuit 3 remains unchanged.

When there is an ambient noise of a relatively low level, the microphone 6 catches a composite sound consisting of an ambient noise component and the sound from the loudspeaker 5. The negative D.C. output of the level adjustor 8 grows by the value which corresponds to the ambient noise component. The input voltage of the adder-amplifier 57 therefore becomes a negative voltage. Since the adder-amplifier 57 is an inversion amplifier, its output is the sum of a negative D.C. voltage corresponding to the ambient noise component and a positive voltage determined by the amplification factor of the adder-amplifier 57 and the resistance of the resistors 53 to 56. If the analog switch 58 is conductive, the positive output voltage of the adder-amplifier 57 is applied through the analog switch 58, smoothened by the resistor 84 and the capacitor 85, and applied to the inoput of the non-inversion amplifier 86. Then, the D.C. current determined by the input voltage of the amplifier 86 and the resistance of the resistor 87 flows through the light-emitting diode 89, and light corresponding to the D.C. current is emitted from the diode 89 to the CdS element 40. The resistance of the CdS element 40 is lowered to reduce the attenuation ratio of the volume adjusting circuit 3. The input level of the power amplifier 4 therefore rises, thereby increasing the volume of sound from the loudspeaker 5.

The louder the sound from the loudspeaker 5 grows, the higher is the output level of the microphone 6. Thus, the negative D.C. output level of the level adjustor 8 rises by the value corresponding to the increase of sound volume of the loudspeaker 5. At the same time the positive D.C. output level of the level adjustor 10 also rises by the value corresponding to the increase of sound volume. As a result, the sound component in the output of the adder-amplifier 57 is reduced substantially to zero. Thus, the loudspeaker 5 generates sound the volume of which is proportional to the ambient noise component. When the ambient noise ceases under this condition, the output level of the adder-amplifier 57 is reduced substantially to zero. If the analog switch 58 is conductive, the capacitor 85 is discharged through the resistor 84 and comes to have zero potential, thereby reducing the volume of sound from the loudspeaker 5.

When the microphone 6 picks up an ambient noise of a high level, the volume of the loudspeaker 5 is increased very much to raise the output level of the rectifier 11, whereby the inversion input level of the level comparator 62 becomes higher than the non-inversion input level of the level comparator 62. If this happens, the output level of the level comparator 62 changes from a positive potential to a negative one. The gate of the analog switch 58 comes to have a negative potential, and the analog switch 58 is rendered non-conductive. The capacitor 85 therefore holds a voltage corresponding to the output voltage of the adder-amplifier 57 immediately before the analog switch 58 has become non-conductive, and the volume of the loudspeaker 5 remains at a high level which corresponds to the voltage held by the capacitor 85.

Suppose the analog switch 58 is not provide and that the output of the adder-amplifier 57 is coupled directly to the resistor 84. Then, the microphone 6 fails to detect the ambient noise if the sound from the loudspeaker 5 is larger enough to mask the ambient noise. In this case, the automatic volume adjusting apparatus fails to respond to the ambient noise as if there were no ambient noise. The volume of the loudspeaker 5 is reduced to such an extent that the ambient noise is not completely masked, and the microphone 6 detects the ambient signal thereby to increase the volume of the loudspeaker 5 again. The sound volume reduction and sound volume increase are repeated, thus annoying the listeners very much. To avoid such a repetition of volume changes, the analog switch 58 is provided.

If the analog switch 58 were rendered non-conductive by a large volume of the loudspeaker 5 and remained non-conductive, the output of the adder-amplifier 57 would not be supplied to the non-inversion amplifier 86 even if the ambient noise level lowers to drop the output voltage of the adder-amplifier 57. The volume of the loudspeaker 5 would not therefore be reduced. The elements provided at the stages succeeding the level comparator 62 are to prevent such an undersirable phenomenon. It will be now described how these elements function.

When the inversion input voltage of the level comparator 62 becomes higher than the non-inversion input voltage, the output level of the level comparator 62 changes from a positive value to a negative value. At the same time, the integrator 67, which has a time constant determined by the resistor 65 and the capacitor 68, starts operating, and its output level changes from a negative value to a positive value. When the output voltage of the integrator 67 rises over the positive voltage of the level comparator 74, the output level of the level comparator 74 changes from a positive value to a negative one. Then, the capacitor 75 and the resistor 76 and 77 generate a trigger pulse, which is supplied to the input of the NAND circuit 78. The NAND circuit 78, inverters 81 and 82, resistor 80 and capacitor 79 constitute a monostable multivibrator. Upon receipt of the trigger pulse, the monostable multivibrator produces a positive pulse having a width which is determined by the resistor 80 and the capacitor 79. The positive pulse is supplied from the inverter 82 to the gate of the analog switch 83. As long as the positive pulse lasts, the analog switch 83 remains conductive, thus short-circuiting the resistor 60. The resistor 59 has such a resistance that the output of the rectifier 11 is not affected even if the resistor 60 is short-circuited. Once the resistor 60 has been short-circuited, the inversion input potential of the level comparator 62 is reduced substantially to zero. The analog switch 58 is therefore rendered conductive and remains so so long as said positive pulse lasts. When the output level of the level comparator 62 changes from a negative value to a positive value, the diode 66 is biased backwardly and made non-conductive. The gate voltage of the FET 69 therefore elevates to zero from a negative value, and the drain-source path of the FET 69, which has been non-conductive, is rendered conductive. As a result, the capacitor 68 is discharged through the drain-source path of the FET 69. The output of the integrator 67 comes to have a negative value, and the integrator 67 is therefore reset.

The above-mentioned series of operations are repeated every time the inversion input voltage of the level comparator 62 becomes higher than the non-inversion input voltage. The width of the positive pulse is sufficiently smaller with respect to the period of time during which said series of operations are repeated once. Every time the positive pulse is generated, the analog switch 58 is rendered conductive. This means that the analog switch 58 detected the output level of the adder-amplifier 57 repeatedly for a short time at regular intervals. The constant current circuit is controlled by the output of the adder-amplifier 57 while the analog switch 58 remains conductive. Since the width of the pulse is sufficiently small in comparison with the time constant determined by the resistor 84 and the capacitor 85, the potential across the terminals of the capacitor 85 will never change abruptly. Thus, the current flowing through the light-emitting diode 89, i.e. load of the constant current circuit, will never change abruptly, either. The output level of the volume adjusting circuit 3 therefore changes slowly, thereby suppressing the masking of the ambient noise. Consequently, the volume of the loudspeaker 5 can be automatically adjusted in a natural manner.

As described above, in the embodiment of FIG. 6, when the level comparator detects a high level output of the volume adjusting circuit, the level comparator holds the output of the subtraction circuit, and at the same time various operations are repeated for a predetermined time thereby to deliver the output of the subtraction circuit from the level comparator, whereby the volume of the loudspeaker is adjusted by the output of the subtraction circuit. The apparatus of FIG. 6 can therefore avoid an unnatural variation of sound volume even if the ambient noise is masked by a large volume of the loudspeaker, and the volume of the loudspeaker can be automatically adjusted in a natural manner.

Figure 7:
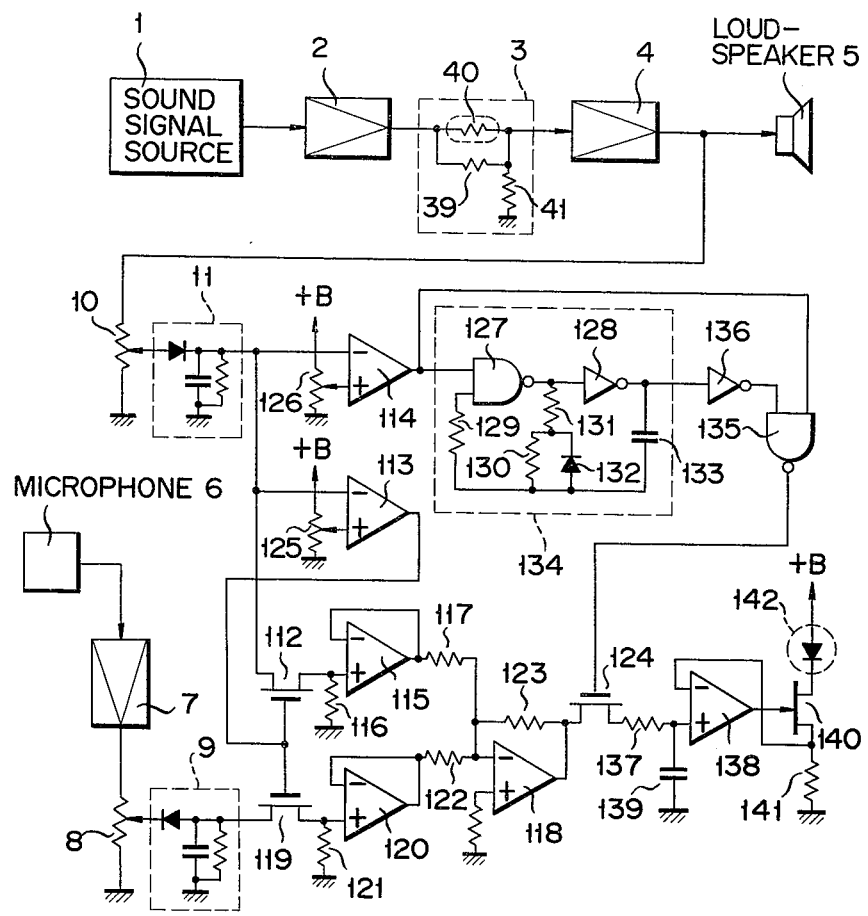

FIG. 7 illustrates another embodiment of the invention which improves the level comparison carried out in the embodiment of FIG. 6.

As shown in FIG. 7, the output of a rectifier 11 is connected to the drain of an analog switch 112, the non-inversion input of a level comparator 113 and the non-inversion input of a level comparator 114. The source of the analog switch 112 is connected to the non-inversioninput of a buffer 115 and the ground through a resistor 116. The output of the buffer 115 is connected to the inversion input of the buffer 115 and to the inversion input of an inversion adder-amplifier 118 through a resistor 117. The output of a rectifier 9 is connected to the drain of an analog switch 119. The source of the analog switch 119 is connected to the non-inversion input of a buffer 120 and to the ground through a resistor 121. The output of the buffer 120 is connected to the inversion input of the buffer 120 and to the inversion input of the adder-amplifier 118 through a resistor 122. The output of the inversion adder-amplifier 118 is connected to the inversion input of the adder-amplifier 118 via a resistor 123 and to the drain of an analog switch 124. The inversion input of the level comparator 113 is connected to a movable contact of a level adjustor 125 which is connected between a positive D.C. power source +B and the ground. The output of the level comparator 113 is connected to the gates of the analog switches 112 and 119. The inversion input of the level comparator 114 is connected to a movable contact of a level adjustor 126 which is connected between the positive D.C. power source +B and the ground.

The output of the level comparator 114 is connected to the control input of a non-stable multivibrator 134 which is constituted by a two-input NAND circuit 127, an inverter 128, resistors 129, 130 and 131, a diode 132 and a capacitor 133. The output of the level comparator 114 is connected also to one input of a NAND circuit 135. The output of the multivibrator 134 is coupled to the input of an inverter 136, the output of which is connected to the other input of the NAND circuit 135. The output of the NAND circuit 135 is connected to the gate of the analog switch 124. The source of the analog switch 124 is connected to the non-inversion input of a buffer 138 through a resistor 137. The non-inversion input of the buffer 138 is connected to the ground via a capacitor 139. The inversion input of the buffer 138 is connected to the source of a FET 140 and to the ground through a resistor 141. The output of the buffer 138 is connected to the gate of the FET 140. The drain of the FET 140 is connected to the cathode of a light-emitting diode 142, the anode of which is connected to the positive D.C. power source +B. A CdS element 40 for receiving light from the light-emitting diode 142 is integrally formed with the diode 142. The CdS element 40 and resistors 39 and 41 constitute a volume adjusting circuit 3.

Now it will be described how the embodiment of FIG. 7 operates.

First, it will be described how the apparatus operates when there if no ambient noise. Also in this embodiment, the level adjustors 8 and 10 are so designed as to render the D.C. output of the rectifier 11 either substantially equal to, or larger than the D.C. output of the rectifier 9. Further, the level adjustors 125 and 126 render the voltage across the ground and the inversion input of the level comparator 113 lower than the voltage across the ground and the inversion input of the level comparator 114.

When the voltage of the level comparator 113 is lower than the minimum output D.C. voltage of the rectifier 11 and when the voltage of the level comparator 114 is higher than the maximum output D.C. voltage of the rectifier 11, the output of the level comparator 113 has a positive potential. Thus, the drain-source paths of the analog switches 112 and 119 are made conductive, whereby the output of the rectifiers 11 and 9 are supplied to the buffers 115 and 120, respectively. As a result, the buffers 115 and 120 produce outputs of the same polarity. These outputs of the buffers 115 and 120 are supplied to the inversion input of the inversion adder-amplifier 118 through the resistors 117 and 122, respectively. The adder-amplifier 118 produces an output the level of which is determined by the amplification factor of the adder-amplifier 118 and the resistances of the resistors 117, 122 and 123. Since the absolute value of the positive D.C. output of the rectifier 11 is substantially equal to, or larger than, that of the negative D.C. output of the rectifier 9, the sum of the inputs to the adder-amplifier 118 becomes zero or has a positive value. The output of the inversion adder-amplifier 118 therefore becomes zero or has a negative value.

Since the voltage of the level comparator 114 is higher than the D.C. output voltage of the rectifier 11, the output of the level comparator 114 has a negative potential. The non-stable multivibrator 134 therefore does not oscillate, and its output has a negative potential. Thus, the NAND circuit 135 receives the negative potential from the level comparator 114 and a positive potential obtained by inverting the negative potential from the multivibrator 134 through the inverter 136. As a result, the output of the NAND circuit 135 has a positive potential and renders the drain-source path of the analog switch 124 conductive. The output of the inversion adder-amplifier 118 is therefore charged in the capacitor 139 through the drain-source path of the analog switch 124 and through the resistor 137 and is supplied to the non-inversion input of the buffer 138. The buffer 138, FET 140 and resistor 141 constitute a constant current circuit which uses the light-emitting diode 142 as a load. The positive D.C. voltage applied to the non-inversion input of the buffer 138 is to be applied on the light-emitting diode 142, and the current proportional to the resistance of the resistor 141 is to flow through the light-emitting diode 142. In this case, however, no current flows through the light-emitting diode 142. This is because the FET 140 is made non-conductive since the input level of the buffer 138 is zero or of a negative value and thus its output level is also zero or of a negative value. Consequently, the resistance of the CdS element 40 does not change, and the attenuation ratio of the volume adjusting circuit 3 remains unchanged, whereby the output volume of the loudspeaker 5 is maintained.

Second, it will be described how the apparatus of FIG. 7 operates in case there is an ambient noise. The microphone 6 picks up a composite sound consisting of the ambient noise and the sound from the loudspeaker 5. The negative D.C. output of the rectifier 9 becomes larger by the value corresponding to the ambient noise component. The sum of the inputs to the inversion adder-amplifier 118 becomes a negative potential, and the inversion adder-amplifier 118 generates a positive D.C. voltage which is proportional to the ambient noise component. If the analog switch 124 is conductive, the positive D.C. output voltage of the adder-amplifier 118 is supplied to the input of the buffer 138 through the analog switch 124 with a time constant determined by the resistor 137 and the capacitor 139. Then, a current determined by the input voltage to the buffer 138 and the resistance of the resistor 141 flows through the light-emitting diode 142. According to this current, or amount of light emitted from the diode 142, the resistance of the CdS element 40 is reduced, thus decreasing the attenuation ratio of the volume adjusting circuit 3. The input level of the power amplifier 4 therefore rises, and do does the output level of the power amplifier 4. As a result, the output volume of the loudspeaker 5 is increased.

The louder the sound from the loudspeaker 5 grows, the higher the output level of the microphone 6 becomes. The negative D.C. output level of the rectifier 9 rises in proportion of the volume increase. At the same time, the positive D.C. output level of the rectifier 11 rises in proportion to the volume increase, too. The sound component in the output of the adder-amplifier 118 is reduced substantially to zero. This is because the absolute value of the positive D.C. output of the rectifier 11 is substantially equal to that of the negative D.C. output of the rectifier 9 when there is no ambient noise. Thus, the loudspeaker 5 generates sound the volume of which is proportional to the ambient noise component in the output of the adder-amplifier 118. When the ambient noise ceases under this condition, the output of the inversion adder-amplifier 118 is reduced substantially to zero. If the analog switch 124 is conductive, the capacitor 139 is discharged through the resistor 137, and the input to the buffer 138 becomes a zero potential. Thus, no current flows through the light-emitting diode 142. The resistance of the CdS element 40 is restored, whereby the output volume of the loudspeaker 5 is brought back to the initial value.

Thirs, it will be described how the apparatus of FIG. 7 operates when there is an ambient noise of a high level. When the microphone 6 picks up the ambient noise, the output volume of the loudspeaker 5 increases very much. Then, the D.C. output level of the rectifier 11 becomes higher than the voltage of the level comparator 114. The output of the level comparator 114 becomes a positive potential, whereby the non-stable multivibrator 134 starts working, thus generating pulses having such a waveform as illustrated in FIG. 3. As a result, the NAND circuit 135 produces pulses having the same waveform as shown in FIG. 3. The width of the pulses during which the pulse level remains positive is sufficiently small with respect to repetition period and the time constant determined by the resistor 137 and the capacitor 139.

The analog switch 124 remains conductive during the positive potential period of the pulse and non-conductive during the negative potential period of the pulse. In response to the pulses the analog switch 124 is rendered alternately conductive and non-conductive. The potential across the terminals of the capacitor 139 is substantially equal to the output level of the inversion adder-amplifier 118 immediately before the analog switch 124 is rendered repeatedly conductive and non-conductive. When the analog switch 124 is non-conductive, the potential of the capacitor 139 is maintained. When the switch 124 is conductive, the potential of the capacitor 139 varies according to the output of the inversion adder-amplifier 118. Since the conductive period of the analog switch 124 is far shorter than the non-conductive period, the potential of the capacitor 139 changes very little in comparison with the variation of the output of the inversion adder-amplifier 118. Thus, every time the above-mentioned positive pulse is generated, the output of the adder-amplifier 118 is detected repeatedly at specific intervals, each time for a very short time. While the analog switch 124 remains conductive, the potential of the capacitor 139 controls slowly the constant current circuit in accordance with the output of the inversion adder-amplifier 118. Thus, the output level of the volume adjusting circuit 3 changes slowly since the current flowing through the light-emitting diode 142, i.e. the load of the constant current circuit does not change sharply. The masking of the ambient noise is therefore suppressed. As a result, the output volume of the loudspeaker 5 can be adjusted in a natural manner.

Suppose the analog switch 124 is not provided and that the inversion adder-amplifier 118 is connected directly to the resistor 127. Then, the microphone 6 fails to detect the ambient noise if the sound from the loudspeaker 5 is large enough to mask the ambient noise. This is equivalent to a drop of the ambient noise level. The volume of the loudspeaker 5 is therefor reduced to such extent that the ambient noise is not completely masked. Then, the microphone 6 detects the ambient noise thereby to increase the output volume of the loudspeaker 5 again. The sound volume reduction and sound volume increase are repeated, thus annoying the listeners very much. Further, if the analog switch 124 were rendered non-conductive by a large volume of the loudspeaker 5 and remained non-conductive, the output of the inversion adder-amplifier 118 would not be supplied to the buffer 138 even if the ambient noise lowers thereby to drop the output voltage of the adder-amplifier 118. The volume of the loudspeaker 5 would not therefore be reduced. To prevent such an undesirable phenomenon, the non-stable multivibrator 134, NAND circuit 135 and inverter 136 are provided at the stages succeeding the level comparator 114.

Now it will be described how the apparatus shown in FIG. 7 operates when the loudspeaker 5 generates no sound, thus rendering the output level of the rectifier 11 lower than the voltage of the level comparator 113. In this case, the output of the level comparator 113 becomes a negative potential and make both analog switches 112 and 119 non-conductive. When these switches 112 and 119 are rendered non-conductive, the input and output of the buffers 115 and 120 become a zero potential because the non-inversion inputs of these buffers 115 and 120 are connected to the ground through the resistor 116 and the resistor 121, respectively. Thus, the output of the inversion adder-amplifier 118 becomes a zero potential, and no current flows through the light-emitting diode 142. As a result, the output level of the volume adjusting circuit 3 is maintained at the initial value. The analog switch 119 remains non-conductive even if an ambient noise exists under these circumstances. The output of the rectifier 9 is not therefore supplied to the buffer 120, and no current flows through the light-emitting diode 142. Accordingly, the volume adjusting circuit 3 is maintained at the initial value.

Suppose the analog switch 119 were not provided and that the output of the rectifier 9 were connected directly to the input of the buffer 120. Then, if the loudspeaker 5 remains silent for a certain period of time and if an ambient noise exists udring this period of time, the rectifier 9 produces a negative D.C. voltage corresponding to the ambient noise. This negative D.C. voltage is supplied to the inversion adder-amplifier 118 through the buffer 120 and converted into a positive D.C. voltage by the adder-amplifier 118. The positive D.C. voltage thus obtained is supplied to the buffer 138 through the analog switch 124, thereby reducing the attenuation ratio of the volume adjusting circuit 3. The moment the loudspeaker 5 starts generating sound under this condition, its output volume inevitably grows too large.

The analog switch 112 may be dispensed with. But, without it, the output of the rectifier 11 would contain a positive D.C. voltage which is generated by a noise or the like in the sound circuit system and which is lower than the voltage of the level comparator 113. If this happens, the positive D.C. voltage is supplied to the inversion adder-amplifier 118 via the buffer 115 and is converted into a negative D.C. voltage. The output of the adder-amplifier 118, which is thus a negative potential, is supplied through the analog switch 124 and the resistor 137 and is charged in the capacitor 139. As a result, the automatic volume adjusting operation is delayed a little by a period of time during which the potential across the terminals of the capacitor 139 changes from a negative value to zero potential when the loudspeaker 5 starts generating sound.

The analog switches 112 and 119 are provided to avoid a delay in automatic volume adjusting operation and an unnecessary increase in the output volume of the loudspeaker 5.

As mentioned above, in the embodiment of FIG. 7, two level comparators are used to detect the level of a D.C. signal obtained from an output sound signal of the volume adjusting circuit. A D.C. signal the level of which is higher than the lower one of the voltages of the two level comparators is taken from a D.C. signal corresponding to a composite sound consisting of the sound from the loudspeaker and an ambient noise, thereby removing the sound component from the composite sound. The output obtained by this subtraction is utilized to control the output volume of the loudspeaker. When the level of the D.C. signal obtained from an output sound signal of the volume adjusting circuit is higher than the higher one of the voltages of the two level comparators, the output obtained by said subtraction is held, the output volume of the loudspeaker is repeatedly controlled for a predetermined time at specific intervals, and then the output obtained by the subtraction is released, thus adjusting the output volume of the loudspeaker little by little. Further, when the level of the D.C. signal obtained from an output sound signal of the volume adjusting circuit is lower than the lower one of the voltages of the two level comparators, the output obtained by the subtraction becomes a zero potential, whereby the output volume of the loudspeaker is not adjusted at all.

As described above, according to this invention there is provided an automatic volume adjusting apparatus wherein the output volume of a loudspeaker is adjusted automatically according to the level of an ambient noise, whereby the volume of sound never becomes unstable even if the ambient noise is masked by too large a sound from the loudspeaker, nor does the output volume of the loudspeaker become momentarily too large when the louspeaker starts generating sound.

What is claimed is:

1. An automatic volume adjusting apparatus comprising:
    a volume adjusting device connected between a sound signal source and a loudspeaker;
    means for generating a first signal corresponding to the level of a sound signal supplied from the sound signal source to the loudspeaker;
    means for generating a second signal corresponding to the level of a composite sound which includes sound generated by the loudspeaker and ambient noise;
    means for processing the first and second signals so as to generate a third signal corresponding substantially to only the level of the ambient noise;
    means for sampling the third signal at predetermined intervals;
    means for holding the output of the sampling means for a predetermined period of time; and
    means for controlling, according to the output of the holding means, the level of the sound signal passing through the volume adjusting device.

2. The automatic volume adjusting apparatus according to claim 1, wherein said holding means has a relatively small write-in time constant and a relatively large readout time constant.

3. The automatic volume adjusting apparatus according to claim 2, further comprising means for detecting the level of a sound signal supplied from said sound signal source to said loudspeaker and means for preventing the supply of the first and second signals to the third signal generating means when the level detecting means detects that the level of the sound signal is substantially zero.

4. The automatic volume adjusting apparatus according to claim 1, further comprising means for detecting the level of the first signal and means for causing said holding means to hold the output of said sampling means for the predetermined period of time when the level of the first signal is higher than a predetermined value and for supplying the output of the third signal generating means to said volume adjusting device when the level of the first signal is lower than the predetermined value.

5. The automatic volume adjusting apparatus according to claim 4, wherein said means for detecting the level of the first signal includes a first level comparator which produces an output when the level of the first signal is higher than a first predetermined value and a second level comparator which produces an output when the level of the first signal is lower than a second predetermined value smaller than the first predetermined value; and further comprising means for supplying the output of said third signal generating means to said volume adjusting device when the level of the first signal is higher than the first predetermined value and lower than the second predetermined value, means for causing said holding means to hold the output of the sampling means for said predetermined period of time, according to the output of the first level comparator, and means for stopping, according to the output of the second level comparator, the volume adjusting operation effected by the output of said third signal generating means.

* * * * *

UNITED STATES PATENT AND TRADEMARK OFFICE
CERTIFICATE OF CORRECTION

PATENT NO. : 4,254,303

DATED : March 3, 1981

INVENTOR(S) : Tetsuya TAKIZAWA

It is certified that error appears in the above—identified patent and that said Letters Patent is hereby corrected as shown below:

IN THE DRAWINGS:

Fig. 7, change the algebraic signs of the comparators 113 and 114 from "$\begin{smallmatrix}-\\+\end{smallmatrix}$" to "$\begin{smallmatrix}+\\-\end{smallmatrix}$".

Signed and Sealed this

Second Day of June 1981

[SEAL]

Attest:

RENE D. TEGTMEYER

Attesting Officer     Acting Commissioner of Patents and Trademarks